United States Patent [19]

Mori

[11] 4,426,737
[45] Jan. 17, 1984

[54] CIRCUIT FOR GENERATING A PUMPING SIGNAL FOR A SURFACE ELASTIC WAVE PARAMETRIC DEVICE IN A RECEIVER

[75] Inventor: Masaharu Mori, Tokyo, Japan

[73] Assignee: Clarion Co., Ltd., Tokyo, Japan

[21] Appl. No.: 345,507

[22] Filed: Feb. 3, 1982

[30] Foreign Application Priority Data

Feb. 6, 1981 [JP] Japan .................................. 56-17254
Feb. 6, 1981 [JP] Japan .................................. 56-17255

[51] Int. Cl.³ .............................................. H04B 1/16
[52] U.S. Cl. .................................... 455/260; 455/293;
455/341; 330/4.9
[58] Field of Search ............... 455/260, 266, 280, 284,
455/293, 295, 296, 302, 311, 341, 323, 325;
330/4.9, 5.5

[56] References Cited

U.S. PATENT DOCUMENTS

| | | | |
|---|---|---|---|
| 3,163,823 | 12/1964 | Kellis et al. | 455/260 |
| 3,215,943 | 11/1965 | Shiren et al. | 455/325 |
| 3,217,259 | 11/1965 | Kotzebue et al. | 455/260 |
| 3,784,916 | 1/1974 | Maurer | 455/341 |
| 3,991,373 | 11/1976 | Maurer et al. | 455/341 |
| 4,233,530 | 11/1980 | Mikoshiba et al. | 330/5.5 |

*Primary Examiner*—Jin F. Ng
*Attorney, Agent, or Firm*—Flynn, Thiel, Boutell & Tanis

[57] ABSTRACT

A receiver is provided with a surface elastic wave amplifier of a parametric amplification type within an HF amplifier unit, and with a circuit for providing pumping power for said surface elastic wave amplifier from oscillating outputs of an IF converting local oscillator of the receiver.

3 Claims, 8 Drawing Figures

CIRCUIT FOR GENERATING A PUMPING SIGNAL FOR A SURFACE ELASTIC WAVE PARAMETRIC DEVICE IN A RECEIVER

BACKGROUND OF THE INVENTION

1. Field of the Invention

The present invention relates to a radio receiver, and more particularly, to a novel and improved radio receiver superior in anti-interference performance and sensitivity.

2. Description of the Prior Art

As well known, the performance characteristics required of radio receivers are generally the following four ones:

(1) Sensitivity
(2) Anti-interference performance
(3) Fidelity
(4) Stability

Radio receivers which meet all the above four requirements can of course be accepted as quality apparatus. Along with the ever-increasing number of broadcasting stations, however, the required performance (2) above, say, the anti-interference performance, has recently been more and more important in this field.

A general means of improving the anti-interference performance is to use narrow-band filters; FIG. 1 shows the construction of a conventional superheterodyne receiver equipped with such filters. In this Figure, the reference numeral 1 denotes an antenna, 2, 4 and 7 indicate filters, 3 refers to a high frequency (HF) amplifier, 5 to a frequency converter, 6 to a local oscillator, 8 to an intermediate frequency (IF) amplifier, 9 to a demodulator, 10 to a low frequency (LF) amplifier and the numeral 11 refers to a speaker. The anti-interference performance of the radio receiver of a such construction will be discussed below.

The antenna 1 does not meet our expectation in respect of the frequency selectivity. Suppose that an HF signal received by this antenna 1 is amplified as it is by the HF amplifier 3; harmful phenomena such as intermodulation or cross-modulation will be caused by the nonlinear effect of the amplifier 3. To avoid this, the filter 2 is connected down stream of the antenna 1.

The frequency converter 5 is substantially a nonlinear circuit which will incur an image frequency interference in addition to the intermodulation or cross-modulation, and to avoid the above, the insufficient frequency selectivity of the filter 2 is covered by another filter 4. The numeral 6 denotes a local oscillator. The filter 7 is provided to select a signal which has been converted in frequency to in intermediate frequency.

As described in the above, the conventional radio receivers are usually provided with 3 filters. Of them, the filters 2 and 4 have been as follows, in case of the received frequency being variable:

(1) Their central frequency is variable;
(2) They each have several filters designed for different frequencies, one such filter being used at any given time; or
(3) They are wide-band filters which let pass all the signals of frequencies within the variable band.

However, the filters in (3) above are not substantially narrow-band ones, and consequently are poor in performance as to anti-interference. Although the filters in (2) above may be used to some extent for a narrow band, many such filters are necessary so that the costs and mounting space will be great. Further, with the filters in (1) above, it is difficult to provide a sufficient frequency selectivity to suppress signals other than a desired signal.

To obtain a sufficient frequency selectivity using the filter in (1), it is necessary to provide an increased number of filter stages, which, however, will lead to an increase of loss. More particularly, if a such filter is used as the above-mentioned filter 2, the noise factor of the radio receiver is adversely affected, and a tracking error of the filter takes place; thus, it is not possible to increase the number of filter stages at random.

To suppress the interference from adjoining channels, there is provided an IF signal selecting filter 7 downstream of the frequency converter 5. This filter 7 may be such that its central frequency is fixed and its subject frequency is low. Accordingly, an inexpensive filter of good selectivity can possibly be used.

It is apparent that the frequency selectivity of the filters 2 and 4 are insufficient to suppress the intermodulation or cross-modulation caused by the HF amplifier 3 and frequency converter 5. The basis of intermodulation occurrence will be described herebelow.

Assume that the received frequency is fd and that there are interference waves $fd \pm \Delta f$ and $fd \pm 2\Delta f$ adjacent to the frequency fd. There occurs in the HF amplifier the frequency fd from the tertiary nonlinear term as below:

$$2(fd \pm \Delta f) - (fd \pm 2\Delta f) = fd$$

This means the occurrence of interference from the waves adjacent to the frequency fd. This frequency varies depending upon the kind of communication being made, and is on the order of 10 kHz in some cases.

Accordingly, to prevent any interference, an HF filter is necessary which can sufficiently suppress the frequency components very near the frequency used in communication. However, there have been available so far only piezoelectric HF filters using crystal, of which the central frequency is fixed. Because of this fixed central frequency, such filters are those in (2) above.

SUMMARY OF THE INVENTION

The present invention has an object the provision of an arrangement to overcome the above-mentioned drawbacks of the conventional radio receivers. To this end, there is provided a radio receiver which is excellent in anti-interference performance and sensitivity, simple in circuit arrangement and cheap in production cost by providing a parametric amplification-type surface elastic wave amplifier in which a filter small in loss due to variation of the central frequency and high in sensitivity is adopted and a means is provided for supplying the surface elastic wave amplifier with pumping power from oscillating outputs of the IF converting local oscillator which is provided in the receiver.

DETAILED DESCRIPTION OF THE PREFERRED EMBODIMENTS

Figure 1:
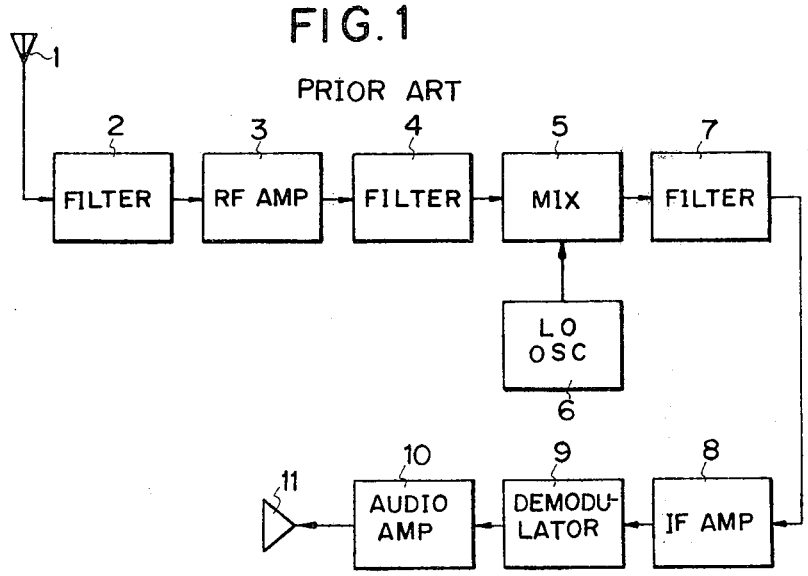
FIG. 1 is a block diagram of a conventional superheterodyne receiver taken as an example.
Figure 2:
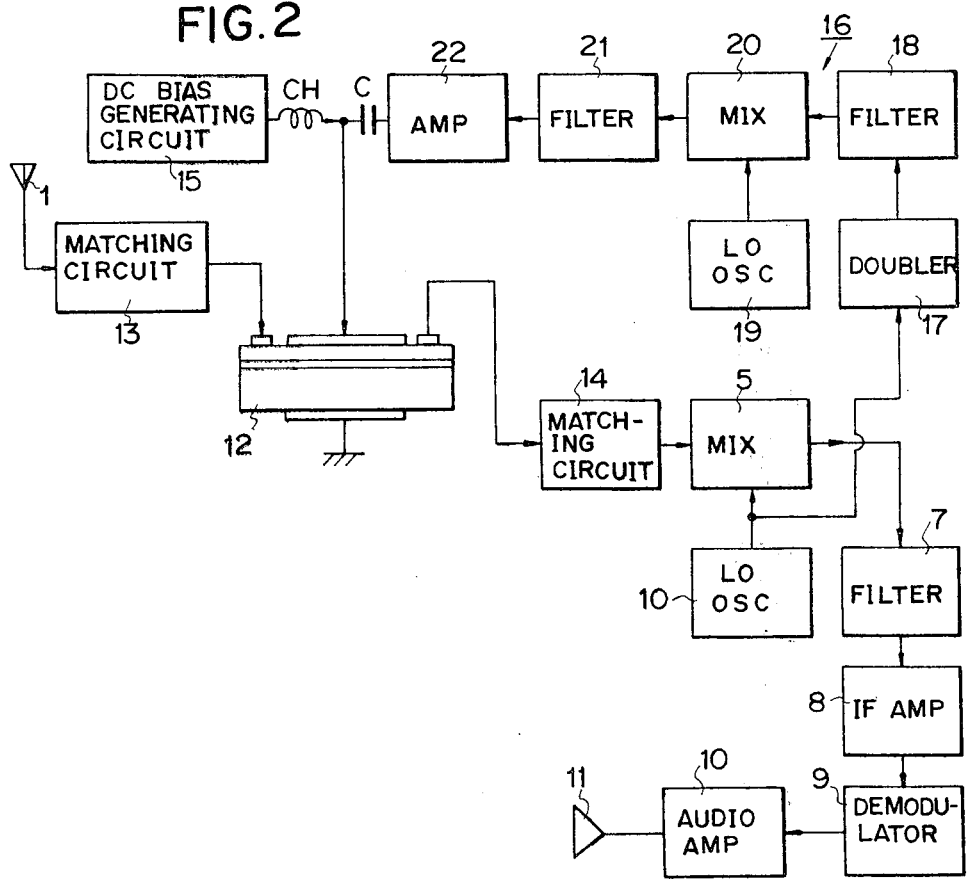
FIG. 2 is a block diagram of an embodiment of the radio receiver according to the present invention.

The present invention will now be described in detail referring to the preferred embodiments illustrated in the drawings. FIG. 2 shows an embodiment of a superheterodyne receiver to which the present invention is applied and in which the reference numerals similar to those in FIG. 1 indicate like elements or parts. In the same figure, the reference numeral 12 denotes a surface elastic wave amplifier, 13 and 14 refer to matching circuits, 15 to a DC bias generating circuit and 16 to a pumping power generating circuit.

Figure 3:
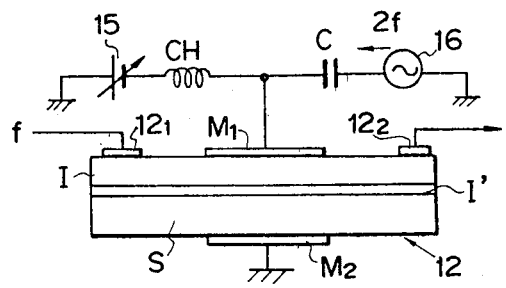
FIG. 3 is a circuit diagram showing an example of the elastic surface wave amplifier used in the embodiment shown in FIG. 1.

FIG. 3 shows an example of said surface elastic wave amplifier. In this figure, S indicates a semiconductive substrate made of silicon (Si), and I a piezoelectric film made of zinc oxide (ZnO). I' denotes a film of silicon oxide ($SiO_2$). The semiconductive substrate S, silicon oxide film I' and piezoelectric film I are so stacked as to form a lamination.

The numerals $12_1$ and $12_2$ refer to an electric signal input means and output means, respectively, which are composed of a surface elastic wave transducer made of a comb electrode. The electric signal input and output means are connected to said matching circuits 13 and 14, respectively, and an electric signal is converted by the input means $12_1$ to a surface elastic wave, and the surface wave signal is converted to an electric signal by the output means $12_2$.

The symbol $M_1$ is an electrode for application of DC bias voltage and pumping power, and this electrode $M_1$ is disposed in the propagation path of the surface wave signal.

The symbol $M_2$ indicates an electrode to provide an ohmic contact with the semiconductive substrate S.

The above-mentioned electrode $M_1$ is connected to ground or earth through a choke coil CH for suppressing of HF current and a DC power source 15 of which the voltage is variable and which is to apply DC bias voltage. This electrode $M_1$ is also connected to the earth through a capacitor C for suppressing of DC current and the HF power source 16 for supplying pumping power.

An electric signal supplied from the matching circuit 13 (FIG. 2) to the input means $12_1$ is converted to a surface wave signal and is propagated over the surface of the piezoelectric film I toward the output means $12_2$. Suppose that the frequency of surface wave signal thus propagated is f, and that DC bias voltage is applied from the DC power source 15 to the electrode $M_1$ on the piezoelectric film I while pumping power of a frequency $2f$ is supplied to the electrode $M_1$. The surface wave signal is amplified under the effect of the parametric interaction due to the nonlinearity of the surface charge layer capacity at the surface of the semiconductive substrate S below the electrode $M_1$, and this amplified signal is converted to an electrical signal by the output means $12_2$ and taken out to matching circuit 14.

The above-mentioned amplification is a function of the length of the electrode $M_1$ in the propagating direction of the surface wave, the nonlinear strength ϵ at the surface of the semiconductive substrate S, and of the frequency of the pumping power. Thus, the amplification may be changed by changing the values of the above-mentioned factors. The above-mentioned strength ϵ depends upon the nonlinearity of the surface charge layer capacitor of the semiconductive substrate S, which is determined by the value of DC bias voltage, and the magnitude of pumping power. In the practical operation, the above two kinds of parameter are changed to adjust the amplification.

Amplification of the surface elastic wave amplifier 12 depends on the nonlinearity of the surface charge layer capacity at the surface of the semiconductive substrate S made of silicon, etc. Since the effect of this nonlinearity is rather great as compared with the piezoelectric body itself as having been illustrated and explained in connection with the conventional apparatus, the pumping power can effectively be reduced for a predetermined amplification.

Figure 4:
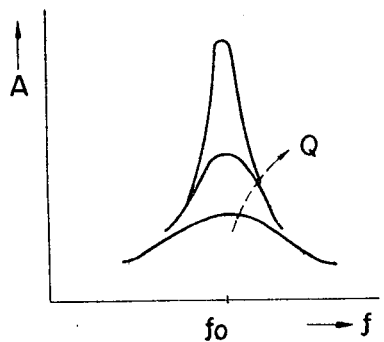
FIG. 4 is a graph showing frequency characteristic curves of the elastic surface wave amplifier in FIG. 3.

Because the parametric amplification by the surface elastic wave amplifier 12 is a kind of positive feedback amplification, it is necessary to increase the electric quality factor Q in order to increase the amplification. FIG. 4 shows the change of frequency response of the amplification of the amplifier 12 with the change of Q. As seen from this figure, as Q increases, the frequency bandwidth narrows while the amplification A is larger. Since the frequency bandwidth can be changed in this way with the change of amplification A, the amplifier 12 can be advantageously used for a function of amplification within a variable bandwidth.

Next, the receiver according to the present invention is so arranged that the pumping power source or circuit 16 does not require an independent oscillator, but a pumping power is obtained from the local oscillator 6 of the receiver as in the following.

In FIG. 2, the numeral 17 refers to a frequency doubler, 18 to a filter, 19 to a local oscillator, 20 to a frequency converter, 21 to a filter, and 22 to a buffer power amplifier circuit. The frequency converter unit composed of the local oscillator 19, frequency converter 20 and filter 21 may be disposed upstream of the frequency doubler 17.

Assume that the received frequency is fs and the intermediate frequency is fi. The oscillation frequency of the local oscillator is selected to be fs+fi (or fs−fi). The output signal of this frequency from the local oscillator 6 is doubled in the frequency doubler 17 to provide a frequency signal of 2(fs±fi). A fundamental harmonic (fs±fi) and frequency components more than 3 times higher than the received frequency are removed from this frequency signal by the filter 18. As the local oscillator 19 delivers at its output a fixed-frequency signal of 3fi, the output from the frequency converter 20 will be composed of the following:

$$2(fs \pm fi) \mp 2fi = 2fs \quad (1)$$

$$2(fs \pm fi) \pm 2fi = 2fs \pm 3fi \quad (2)$$

Namely, the frequency signals of 2fs, 2fs+3fi (when the oscillation frequency of the local oscillator 6 is selected to be fs+fi) and 2fs−3fi (when the oscillation frequency is selected to be fs−fi) are delivered from the frequency converter 20. Since the frequency component of 2fs±3fi of the frequency signals is unnecessary, it is removed by the filter 12, and only the component of 2fs is amplified by the buffer power amplifier circuit 22 and supplied to the surface elastic wave amplifier 12.

Suppose that the lower limit of receivable frequencies is $fs_{min}$ and upper limit is $fs_{max}$. The frequency range of the pumping power is $2fs_{min}$ to $2fs_{max}$. In this case, the outputs corresponding to the above equation (2) are:

$$2fs_{min} \pm 3fi \text{ to } 2fs_{max} \pm 3fi \qquad (3)$$

$2fs_{min}+2fi$ in (3) may take a value very near $2fs_{max}$ or it may be less than $2fs_{max}$, or $2fs_{max}-3fi$ may take a value very near $2fs_{min}$ or it may be more than $2fs_{min}$; in this case, such unnecessary components cannot be removed by the filter 21 alone.

Figure 5:
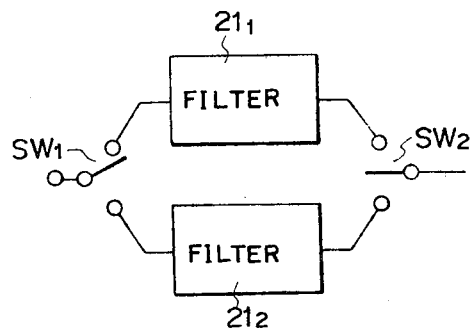
FIG. 5 is a partial block diagram showing a variation of another embodiment according to the present invention.

Accordingly, in this case a plurality of filters 21 is provided as at $21_1$, $21_2$, . . . as illustrated in FIG. 5, and they are used by appropriately selecting them by means of the switches SW1 and SW2 according to the received frequency.

In the above case, the frequency converter 20 may be of an image rejection type instead of providing the plurality of filters 21. Since the image-rejection type frequency converter does not substantially deliver the components shown in the equation (2) above corresponding to an image frequency, the filter 21 may be eliminated or may be a simpler one by using a frequency converter of a such rejection type.

Figure 6:
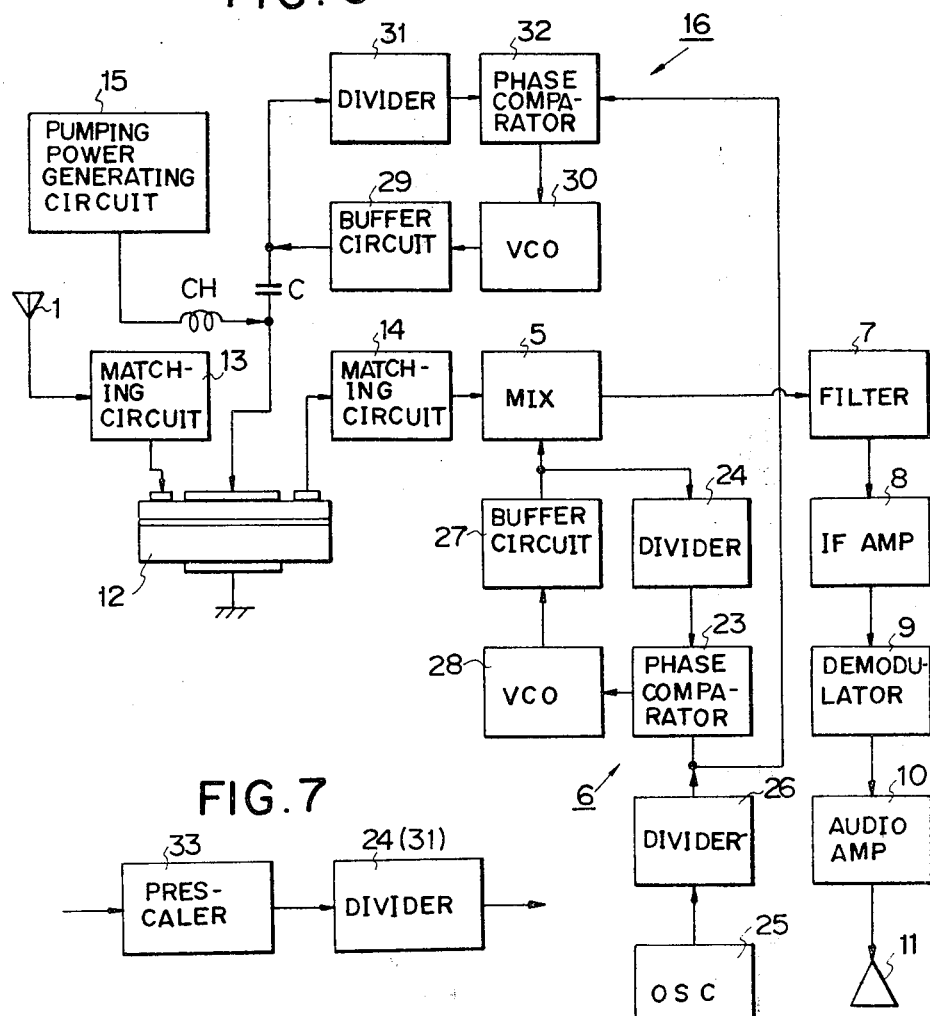
FIG. 6 is a block diagram of another embodiment of the present invention.

FIG. 6 shows a further embodiment of the radio receiver according to the present invention. In this embodiment, the local oscillator 6 and pumping power source or circuit 16 each have the form of a phase locked loop (PLL) circuit composed, respectively, of a buffer circuit 27, 29, voltage-controlled oscillator 28, 30, programmable divider 24, 31, and a phase comparator 23, 32, and further, a divider 26, common to a reference oscillator 25, which divides the oscillation output of the latter.

In the above embodiment, the pumping power circuit and IF converting local oscillator of the surface elastic wave amplfier have the structure of a PLL circuit; so, the superheterodyne receiver is extremely stable in operation. The pumping power circuit utilizes an independent oscillator 25. This oscillator must be sufficiently stable to make the most of the narrow-band characteristic of the surface elastic wave amplifier. Because of the variable frequency and stability, the PLL circuit is optimum for supply of pumping power, and the two PLL circuits share the reference oscillator and divider 26. Therefore, the circuit configuration is simplified and the manufacturing costs can be reduced.

Figure 7:
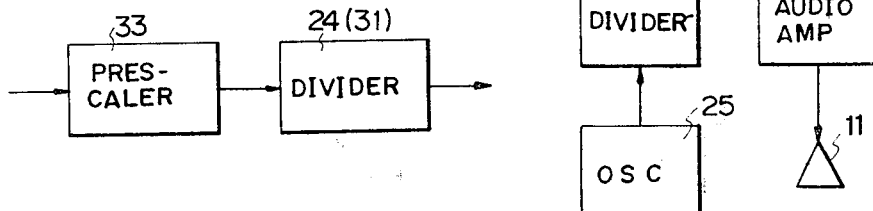
FIGS. 7 and 8 are partial block diagrams, respectively, showing variations of a further embodiment according to the present invention.
Figure 8:
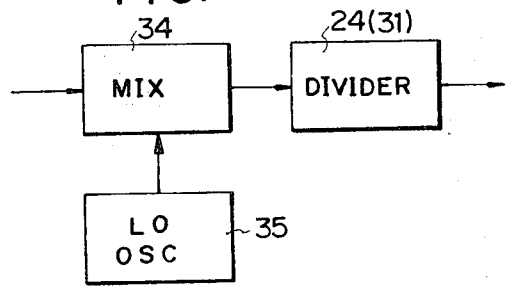

The programmable divider 24, 31 may have provided upstream thereof a pre-scaler 33 (FIG. 7) or mixer 34 and local oscillator 35, as shown in FIG. 8.

As described above, the surface elastic amplifier 12 can be used as a HF amplifier with great gain, high selectivity and variable tuning by supplying an appropriate DC bias voltage and pumping power (for variable tuning, it suffices to use a pumping power frequency two times higher than a received frequency). This surface elastic wave amplifier 12 may be substituted for the conventional filters 2 and 4 (FIG. 1), and HF amplifier 3.

Because of the high selectivity of the amplifier 12, it is possible to suppress frequency components near the received frequency which could not be suppressed by the conventional variable tuning type amplifier, and consequently prevent harmful phenomena such as intermodulation or cross-modulation which have been experienced in the conventional HF amplifier and frequency converter. Further, since the mechanism of amplification of the surface elastic wave amplifier is a parametric amplification, the amplifier is substantially of low noise and of an increased sensitivity.

The filter 7 used in the IF stage need not be a high-performance one.

Besides these, since the receiver according to the present invention is so arranged that the surface elastic wave amplifier is supplied with pumping power from the oscillating outputs of the IF converting oscillator, the pumping frequency, which is required to be two times higher than the received frequency, is determined only by the frequency of the local oscillator for converting the frequency to the intermediate one, which permits simpler construction of the receiver.

The embodiments of the invention in which an exclusive property or privilege is claimed are defined as follows:

1. A receiver for receiving signals at a selected frequency, comprising a high frequency amplifier, means for supplying a high frequency signal to an input of said high frequency amplifier, a first local oscillator, and means responsive to said first local oscillator and to said high frequency amplifier for converting a high frequency signal from an output of said high frequency amplifier to an intermediate frequency signal, said high frequency amplifier including a surface elastic wave parametric amplifier and pumping power supply means for supplying a pumping input of said surface elastic wave parametric amplifier with a pumping signal, said pumping power supply means including a frequency doubler circuit connected to said first local oscillator, a second local oscillator, mixer means for mixing an output of said second local oscillator and a signal from an output of said frequency doubler circuit, and filter means connected to an output of said mixer means and coupled to said pumping input of said surface elastic wave parametric amplifier for passing only signals having a frequency which is substantially twice said selected frequency, said filter means including a plurality of filters having pass bands with different center frequencies and switching means for coupling to said output of said mixer means and said pumping input of said surface elastic wave parametric amplifier a respective said filter having a pass band center frequency which is substantially twice said selected frequency.

2. A receiver for receiving signals at a selected frequency, comprising a high frequency amplifier, means for supplying a high frequency signal to an input of said high frequency amplifier, a local oscillator, and frequency converting means responsive to said first local oscillator and to said high frequency amplifier for converting a high frequency signal from an output of said high frequency amplifier to an intermediate frequency signal, said high frequency amplifier including a surface elastic wave parametric amplifier and pumping power supply means for supplying a pumping input of said surface elastic wave parametric amplifier with a pumping signal, said local oscillator including a reference oscillator and said pumping power supply means including a first phase locked loop circuit, said first phase locked loop circuit including a first phase comparator having an input connected to said reference oscillator, a first voltage controlled oscillator responsive to an output of said first phase comparator, a first buffer amplifier circuit responsive to an output of said first voltage controlled oscillator and having an output coupled to said pumping input of said surface elastic wave parametric amplifier, and a first frequency divider having an input connected to said output of said first buffer amplifier circuit and an output connected to a further input of said first phase comparator.

3. The receiver according to claim 2, wherein said frequency converting means includes a mixer circuit and said local oscillator includes a second phase locked loop circuit, said second phase locked loop circuit including a second phase comparator having an input connected to said reference oscillator, a second voltage controlled oscillator responsive to an output of said second phase comparator, a second buffer amplifier circuit responsive to an output of said second voltage controlled oscillator and having an output connected to an input of said mixer circuit, and a second frequency divider having an input connected to said output of said second buffer amplifier circuit and an output connected to a further input of said second phase comparator.

* * * * *